United States Patent [19]

Grudkowski et al.

[11] Patent Number: 5,121,121
[45] Date of Patent: Jun. 9, 1992

[54] FAST A/D CONVERTER

[75] Inventors: Thomas W. Grudkowski, Glastonbury, Conn.; Gilbert L. Johnson, Saratoga; Michael A. Basic, San Jose, both of Calif.

[73] Assignee: United Technologies Corporation, Hartford, Conn.

[21] Appl. No.: 658,823

[22] Filed: May 15, 1991

[51] Int. Cl.⁵ .............................................. H03M 1/12
[52] U.S. Cl. ...................................... 341/172; 341/122
[58] Field of Search ..................... 341/122, 155, 172

[56] References Cited

U.S. PATENT DOCUMENTS

| | | | |
|---|---|---|---|
| 4,742,333 | 5/1988 | Willhite | 341/159 |
| 4,833,445 | 5/1989 | Buchele | 341/118 |
| 4,967,198 | 10/1990 | Seckora | 341/150 |

*Primary Examiner*—A. D. Pellinen
*Assistant Examiner*—Marc S. Hoff

[57] ABSTRACT

A high speed analog to digital converter system employs a set of ACT/HACT devices in parallel to buffer a high speed data sampling rate to the processing rate of the analog to digital converters employed. Calibration is maintained by periodic comparison of the results of the same input data.

3 Claims, 2 Drawing Sheets

FAST A/D CONVERTER

TECHNICAL FIELD

The field of the invention is that of fast analog to digital (A/D) conversion.

BACKGROUND ART

In the art of analog to digital (A/D) conversion, there has been a persistent problem in that sampling of input signals can be done at a fairly high rate and high bit accuracy but the process of converting a stored analog sample of data to a high accuracy digital representation is inherently slower than the sampling process. In addition, there is the related problem that performing a comparison in the analog domain is subject to the inherent accuracy limitations of analog signals. In the field of advanced analog to digital conversion, in which signals extending over a large dynamic range and having a very high frequency component are to be digitized, these problems are more severe.

DISCLOSURE OF INVENTION

The invention relates to an improved high speed analog to digital converter, in which the input circuit signal is sampled by storage within an acoustic charge transport memory device used as a rate buffer. The stored set of samples within the memory device is transferred to a conventional analog to digital processing unit at a rate slow enough to be acceptable to that unit. The time duration, or the length of time of a sample, may be extended by sampling in consecutive portions of the input with as many ACTs/HACTs as desired. Consistency is obtained by overlapping the samples in time and performing conversion operations to ensure correction for discrepancies between sequential samples.

Other features and advantages will be apparent from the specification and claims and from the accompanying drawings which illustrate an embodiment of the invention.

BEST MODE FOR CARRYING OUT THE INVENTION

Figure 1:
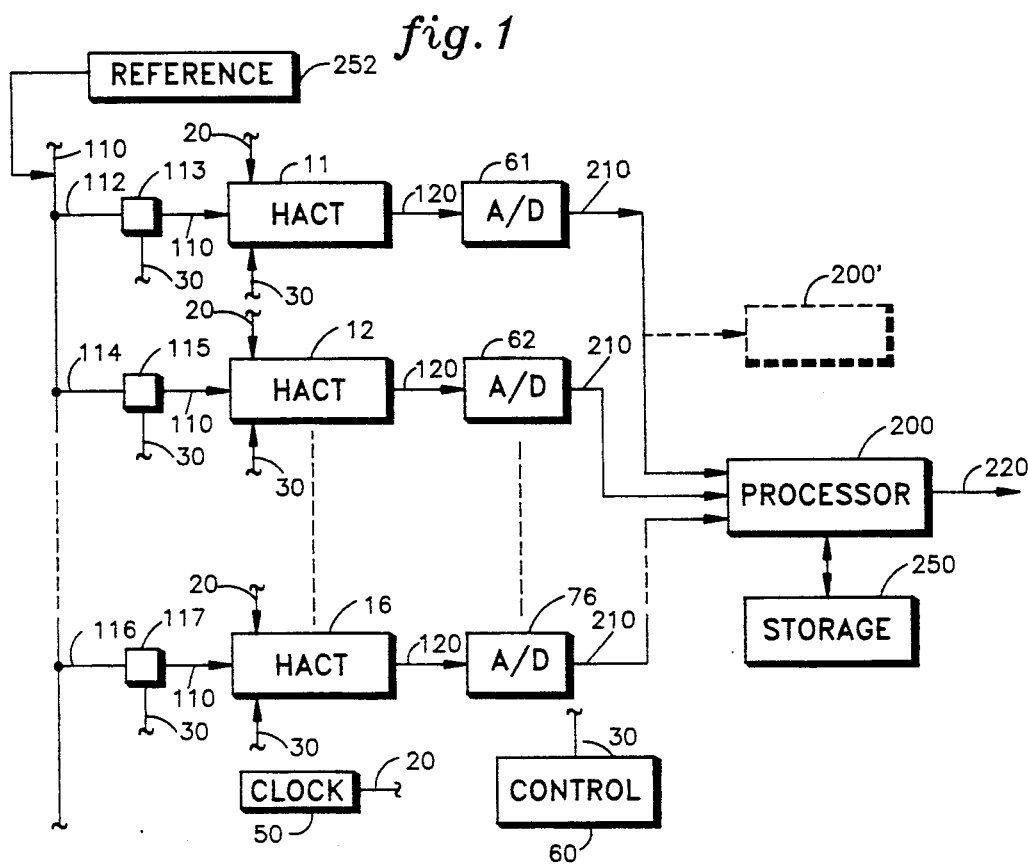
FIG. 1 illustrates in schematic form an embodiment of the invention.

In the course of this analog to digital conversion of a lengthy high speed input signal, the signal enters a system according to the invention on line 110 on the left of FIG. 1 and passes downwardly. A series of ACT (or in the preferred embodiment HACT, standing for heterojunction acoustic charge transport) devices 11, 12 and 16, illustratively formed on GaAs substrates, as shown in U.S. Pat. No. 4,893,161, sample portions of the incoming signal that are tapped off on lines 112, 114 and 116. Line 110 may be a wire or a waveguide and lines 112 to 116 are connected in a manner that will not perturb the incoming signal, as is known to those skilled in the art in conventional practice. An optional preprocessor module 113, 115, 117, etc., may be inserted to apply a fixed or variable phase shift correction to the incoming signals and/or to gate the signals. The function of the phase shift modules is to compensate for differential phase shifts in the various signal paths into the several buffer modules. The phase shift circuits may apply a fixed phase shift that is determined during the system calibration or they may be controlled to apply a phase shift that may be periodically adjusted in response to shifts during system operation that result from environmental effects such as temperature. Alternately, the compensating phase shift may be applied at each HACT device to the SAW frequency clock signals on bus 20. Appropriate calibration tests will be performed to correct for the inevitable differences between the several channels. Correction in both amplitude and phase may be applied to the digital output of the analog to digital converters or, as discussed above, to the incoming signals. The preprocessors may also include a linear gate to gate the analog signal through without distortion. Examples are a PIN diode switch (Anaren Model 80170) or a double balanced mixer (Watkins-Johnson Model WJ-M1).

Figure 2:
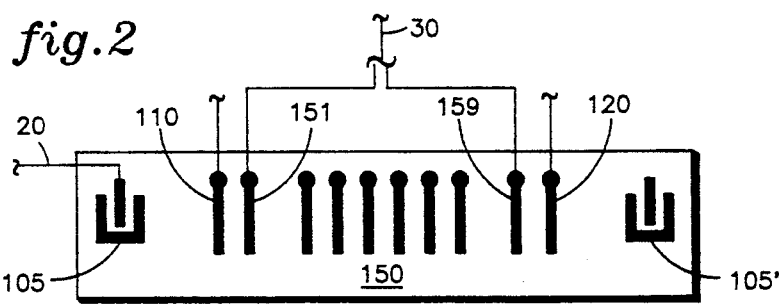
FIG. 2 illustrates, in partially schematic, partially pictorial form, a buffer for use in the systems of FIG. 1.

Within each of the ACT/HACT modules, as illustrated in FIG. 2, timing control signals enter along bus 20 from common coherent frequency clock 50 to transducer 105 that initiates coherent surface acoustic waves (SAW) travelling within each of the modules, and also controls the timing of other operations. This SAW for each module samples the incoming signal and collects a charge packet within a semiconductor charge transport channel that is carried along by the SAW. The sampling rate is determined by the frequency of the SAW. A set of stored samples may be stored by the application of a holding potential to a set of taps 150 in FIG. 2 on the surface of the device, as is disclosed herein. This sampling operation may be performed at a very high rate, up to the gigahertz range. This frequency range is, of course, much higher than conventional analog to digital electronic systems can handle for high bit accuracy.

Figure 3:
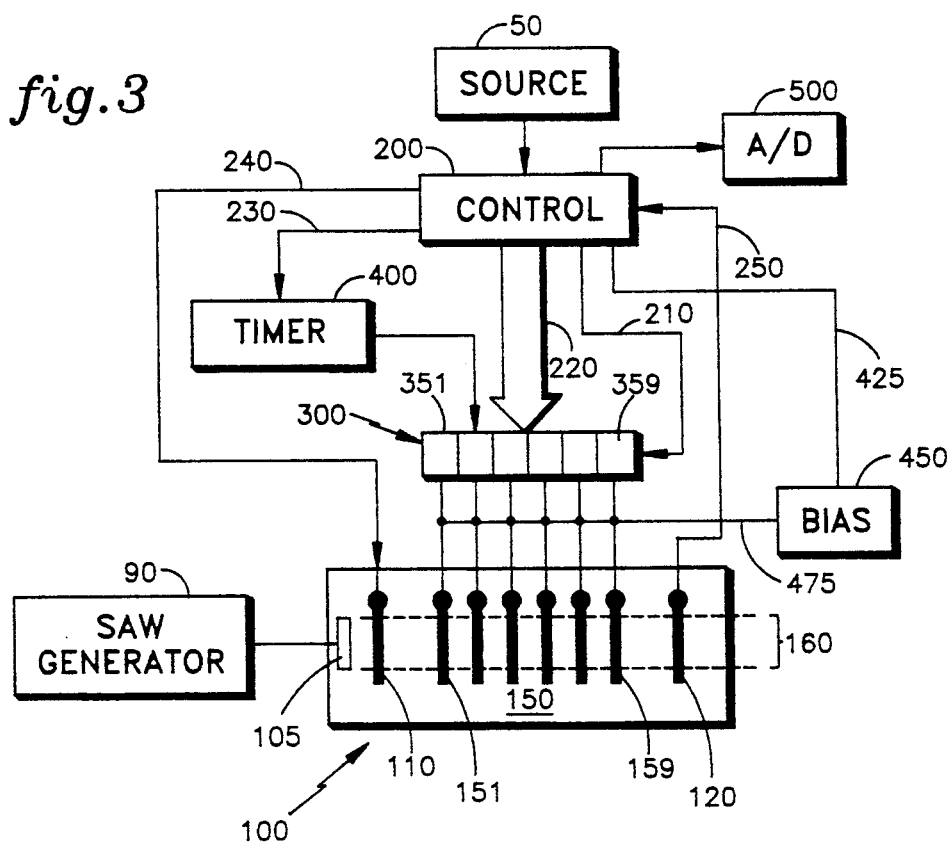
FIG. 3 illustrates in schematic form a FIFO buffer in more detail.

Referring now to FIG. 3 in which corresponding elements have the same number as FIG. 2, there is shown a FIFO (first-in-first-out) memory constructed from an ACT/HACT device 100 in a top view having an input electrode 110 and an output electrode 120. ACT/HACT device 100 may be constructed as described in U.S. Pat. No. 4,893,161 or other conventional ACT or HACT geometry embodiments. A SAW signal is generated by transducer 105 controlled by a SAW frequency generator 90. A data signal comes from a source 50 through a controller 200, then along line 240 into the input electrode 110 of the device. This signal is sampled by the SAW waveform as it passes beneath electrode 110, so that electron packets are injected into the charge transport channel.

When enough time has passed so that the SAW wave has carried the sampled signals past a series of tap electrodes, labeled 151 for the first one, 159 for the last one and collectively referred to by the numeral 150, a blocking voltage of conventional magnitude, which is usually less than several volts and greater than the SAW potential of less than or equal to 1 volt, is applied to electrodes 150 by switching device 300, which in this embodiment is a shift register that will be described below. A potential is applied to each of tap electrodes 150 sufficient to trap and hold the charge packet then underneath it. The stored signal may cover only a portion of the tap electrodes and need not have a long enough duration to extend the entire length. The sampled waveform is thus stored for as long as the blocking potential is present, and consistent with the charge storage time in the semiconductor (typically between 100-1000 μsec). The SAW is preferably continuous throughout the storage process, so that it need not be restarted when the charge packets are released.

When the blocking potential is released on one or more electrodes, the SAW will carry the corresponding charge packet(s) to output electrode 120. A signal corresponding to the magnitude of the sampled input signal then appears on electrode 120 for further processing as desired. Shift register 300 has a number of cells 351-359, one cell corresponding to each of tap electrodes 150. It includes conventional serial or parallel load, parallel unload hardware. Controller 200 sends signals along line 230 to timer 400 which, in turn, sends signals to shift register 300. The control signals going into shift register 300 come from controller 200 along line 210. Signals may also be sent on a bus indicated by the arrow labeled 220 to shift register 300 in a parallel load fashion. The convention will be used here that a logic 1 signal represents the voltage required to trap a charge packet and the logic 0 signal is the absence of that voltage. The magnitude of the voltage will depend on the particular geometry and electrical characteristics of the ACT-/HACT device in question and is readily determined by those skilled in the art. When it is desired to store the data signal carried by the SAW, timer 400 will send a signal to register 300 which will pass out a uniform logic 1 to each of tap electrodes 150. Those skilled in the art will readily appreciate that electrodes 150 may be in constant electrical contact with the cells of register 300, may be gated to respond to the cell data only when the gate is open, etc.

When it is desired to read out the stored signal, zeros will be shifted into shift register 300 along line 210, one by one. After the first zero is shifted into cell 359, corresponding to tap electrode 159, the tap electrodes are exposed to the new configuration with the blocking potential being on all but one of the electrodes. The last charge packet, under electrode 159, is now free to move and will be carried by the SAW to output electrode 120 from which a signal will travel along line 250 into controller 200 and out into analog to digital converter 500.

At the next stage, after a delay that is set to accommodate the next processing unit connected to output electrode 120, another zero has been shifted into register 300 and both the packets beneath electrode 159 and the next one to its left are now free. The next charge packet in sequence is released from the next electrode, passes under electrode 159 and on out to the output electrode 120. This process continues until all the charge packets have been released, with whatever spacing or time interval that is desired between them. Conventionally, this time interval will be uniform, but it does not need to be.

Figure 4:
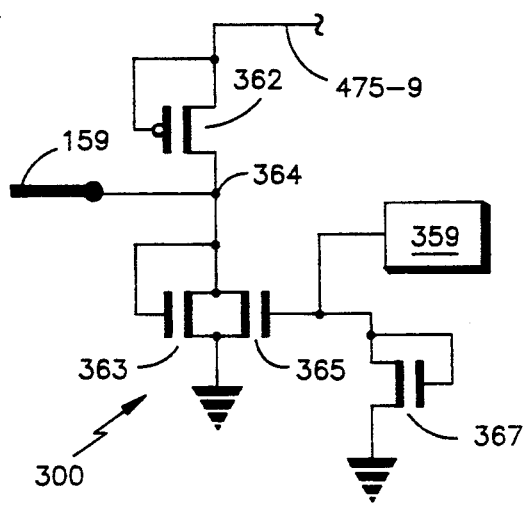
FIG. 4 illustrates a bias circuit for use in the buffer of FIG. 3.

The implementation of this method of releasing samples will be evident to those skilled in the art. For example, a bias network shown schematically in FIG. 1 as box 450 will maintain the tap electrodes at the blocking potential unless they are pulled down by a zero in register 300. A simple interface that may readily adapted by those skilled in the art is shown as subcircuit 360 of FIG. 4, in which a pair of transistors 362 and 363 are connected in series between 475-9, the ninth line in bundle 475, and ground. An intermediate node 364 is connected to electrode 159 and controlled by transistor 365 that, in turn, is controlled by cell 359 of register 300.

If line 475 is at a positive potential calculated to maintain node 364 at the blocking potential, and transistor 365 is a conventional N-channel FET, the application of a positive voltage to the gate will bring node 364 close to ground and a zero potential on the gate will allow node 364 to rise toward the voltage set by the ratio of resistors 363 and 366. Optional pull-down transistor 367 is sized to not disturb the operating points, only to pull down the gate of transistor 365 if the output of cell 359 is floating. Those skilled in the art will readily be able to modify the transistor polarity or bias level, etc. to accommodate their needs. It does not hurt if the shifting hardware within cell 359 temporarily shifts logic states during the transfer process so that electrode 159 shifts between the blocking potential and the release potential while control bits are shifted through cell 359, because there is no charge packet beneath it to be affected.

Referring now to FIG. 2, there is shown an alternative version of ACT/HACT device 100. In this version, there is an additional set of transducer and pickup electrodes. In this case, the pickup electrode may be separate or the same as the signal input electrode. Counterpart transducer 105' and pickup 120' permit "time-reversal" of the incoming signal. Once the signal has been stored by application of the proper voltage to electrodes 150, the SAW generated by transducer 105 may be turned off and replaced by a SAW generated by transducer 105'. In that case, the first charge packet to be released is that stored under electrode 151 and the last charge packet to be released is that stored under electrode 159. The effect is that of reversing the sequence in time of the signal. This embodiment may be used in implementing a LIFO memory or in many other applications evident to those skilled in the art.

Those skilled in the art will readily be able to devise different embodiments of the invention. For example, shift register 300 may be replaced with a conventional decoder, in which case the release operations may be performed by control 200 sending a sequentially increasing number to the decoder which, in turn, opens consecutively the right-most electrode and then the others. A ROM or other PLA device could be used to respond to an input count or signal in a nonlinear fashion, so that a signal that is sampled at the uniform time internal of the SAW may be released with a variable time interval between samples. The path between source 50 and lines 240 within control 200 may be a direct connection, or the path may pass through a gate, either a linear gate for analog applications or a nonlinear gate for digital applications. In the former case, the connection is effectively outside contact 200. In the latter case, the connection may be controlled so that the sampling is selective. For example, the input signal could be sampled on the occurrence of some condition detected by some portion of a total system, with an irregular flow of samples into unit 100. Each sample would be trapped by the application of a blocking potential to the last unoccupied electrode at a time when the charge packet passes through. They can then be released at regular or irregular intervals.

As an additional example, if a complex signal is to be sampled at a higher rate during some portion of the total sampling period, the SAW can be run at multiple of the lowest desired sampling rate (e.g., 900 MHz, for a 90 MHz lowest rate). During periods of high interest, the signal is passed through and sampled at the full rate. During periods of less interest, the signal is gated through at only every tenth SAW peak, so that the sampling rate is one tenth of the maximum rate. Further, the device may be used to sum two or more consecutive charge packets. If the next device in line will store the released charge from electrode 120 for a period greater than the delay between consecutive SAW peaks, two or more electrodes may be switched to the release potential, so that their charge packets will be summed in the next unit. Also, summing may be performed within device 100 by holding the nth electrode at the blocking potential while the packets are trapped beneath it.

The sampling operation at electrode 110 is conventionally performed with a bias to put the device in a more linear range, so that a zero signal will be represented by a finite amount of charge. This charge is a simple offset that can be subtracted off as is convenient. When "empty" packets accumulate under an nth electrode, the offset amounts will accumulate there. This problem may be solved by accumulating the empty packets under the nth electrode and trapping the desired packet under the next free electrode toward the input terminal (the (n-1)th electrode in this case). The accumulated charge under the nth electrode will pass out through the output and be ignored by the next unit in line. The same logic that identified the desired packet to be trapped will pass a flag signal identifying the (n-1)th electrode as the one having a packet of interest and the preceding nth electrode as the one with the packet to be discarded.

The different logical units shown in the drawing may be combined or separated in various fashions, well known to those skilled in the art. For example, a single-chip general purpose computer may perform the functions of units 200, 400 and 300. Similarly, the function of controlling the tap electrodes may be accomplished by a register as shown or by a modulation algorithm that releases the electrodes consecutively, in response to signals from controller 200. Such applications for varying the time between release of the sampled charge may be useful for modulating the signal time or phase of the input signal for intentional signal distortion. The input sampling may be controlled through timer 110 to select various portions of the input signal to be initially sampled. Since the sampling process is linear, the device is well suited to analog applications, but it can be used to advantage in digital applications as well.

Referring back to FIG. 1, the principles of the embodiment of FIG. 3 can overcome the discrepancy in sampling and processing rate at high bit accuracy, so that HACT devices 11 through 16 function as FIFO (firstin, first-out) buffer memories. The control signals for storing the charges and releasing them sequentially are sent by controller 60 on a collection of lines labeled by the numeral 30. Once the charges have been stored, the first one in time is released by removing the blocking potential on its corresponding electrode to permit the charge to travel from buffer 11 into analog to digital converter 61. The first charge packet in module 12 is released to pass into A/D converter 62, etc., in parallel with the processing in converter 61. These A/D converters perform the standard conversion and pass the results out to the parallel buses 210, each an N-bit/sec bus having a width corresponding to the resolution of the A/D converters. Further, control signals shown in the drawing as lines 30 (to reduce confusion) control the release of the signals onto the bus in any desired format and sequence. Separate bus lines may be used into parallel interconnected processing devices 200', etc., if desired. For maximum dynamic range, the stored charge packets are released sequentially at a rate of about 10 million samples per second (MSPS) equivalent to the capabilities of high speed analog to digital systems, such as the 14 bit AD1512, available from ELSIN Corporation, Sunnyvale, Calif., 4186. If the A/D converters can handle N conversions/sec and the data sampling rate must be M samples/sec, then the number of ACT/HACT buffers required is M/N. Thus, an input sampling rate of 100 MSPS would require 10 A/D converters. Bit accuracy is preserved, provided that each HACT module can sustain 14 Bit accuracy at 100 MSPs.

HACT devices 11 through 16 may be controlled to accept a block of samples that are contiguous in time or to interleave the samples. In the contiguous version, HACT 11 would accept the first 256 samples, HACT 12 would accept the next block, etc. The incoming signals pass on lines 112, 114, etc. into and through the several SAW devices until a timed blocking potential is applied to the sampling electrodes. In an alternative embodiment, a linear gate (PIN diode switch or balanced modulator) is incorporated in each preprocessor 113, 114, etc. or integrated within the HACT module to pass samples into the module without distortion of the signal. If desired, a pipeline system could gate the first sample into HACT 11, the second into HACT 12, etc., with a corresponding sequential release into processor 200. Otherwise, the samples may be rearranged in storage unit 250 to restore the time sequence. In either case, comparison of samples will be made as described below.

An important problem in such a parallel system is ensuring consistency between modules. This is effected, according to the invention, by overlapping a substantial portion of the samples. For example, HACT 11 may store 256 samples, of which 32 are used for comparison. The last 32 samples in HACT 11 overlap in time as nearly as possible the first 32 samples in HACT 12, etc. Since the raw signals are passing through the several sampling modules at the same time, the overlap is accomplished by adjusting the application of the blocking potentials; i.e. the potential is applied to unit 12 when the last 32 samples of the set in unit 11 are still present in unit 12. These overlapping samples are digitized and passed to processor 200. There, they are processed and/or stored in storage unit or memory 250 and a conventional comparison is made between the overlapping signals to derive conversion constant parameters of the form $A_{12} = a A_{11} + b$, where the $A_i$ are the amplitudes of corresponding digitized representations of the same signal sample and a and b are coefficients that are obtained by fitting the data. Both amplitude and phase corrections may be calculated in a straightforward fashion, well known to those skilled in the art. Since there is time overlap between adjacent blocks, 32 of the samples will be discarded or combined. For example, the last 32 samples from HACT 11 may discarded and replaced by the first 32 from HACT 12; alternate samples may be used from HACTs 11 and 12; or the average of samples from the two HACTs may be used. In the interleaved embodiment, comparison between channels may be made in a separate calibration run, or by periodically passing the same data sample into two or more buffers. For example, on every nth sample time, all ACT/HACT devices would accept the same data. Only one of the digitized outputs would be stored and retained in the data stream being processed and the total set of outputs for that point would be used in the calibration process.

This comparison may be calculated for every input signal set of 256 points for self consistency. If desired, reference signals may be emitted from reference 252 and fed into line 110 for offline calibration. The reference may be a constant voltage or a set of constant voltages, a ramp, or any other convenient form. These reference signals will be inserted when data is not coming in, of course. Since the signals will depend on temperature, stress on the ACT chips, and a number of other variables, an important advantage of the comparison process, whether internally or through a reference, is that correction is provided for variation throughout system operation, not just for a calibration run. Conventional calibration will be performed in the initial set up, of course, but the high conversion accuracy required of state of the art applications may demand that comparisons be made throughout an operating period such as by a self-calibrating feedback loop.

Depending on the accuracy required of the system, phase correction in real time may be required of either the input signal coming along lines 112, 114, etc., or of the SAW clock on lines 20 that performs the sampling operation. Illustratively, the SAW phase shifter techniques illustrated in U.S. Pat. No. 4,233,573 can be used to ensure uniformity.

In addition, control of the temperature of the individual modules could be used to provide adjustment for module-to-module fabrication errors or crystal orientation effects in order to equalize the SAW velocity for all modules. Stability of the HACT/ACT sampling aperture is another important requirement and may be provided by circuits prior to the HACT input.

It should be understood that the invention is not limited to the particular embodiments shown and described herein, but that various changes and modifications may be made without departing from the spirit and scope of this novel concept as defined by the following claims.

What is claimed is:

1. An analog to digital conversion system for sampling and converting a high speed input signal to a set of digital representations of samples of said input signal, comprising:

input distribution means for distributing an analog data signal;

a set of at least one sampling module connected to said input distribution means, for sampling and storing a set of analog samples of said analog data signal at an input sample rate and releasing said set of analog signals at an output rate slower than said sample rate;

a corresponding set of digitizing modules connected to corresponding ones of said set of sampling modules, for converting said set of analog samples to digital sample representations of said set of analog samples;

controller means connected to said set of sampling modules, for controlling said set of sampling modules to sample said high speed input signal at predetermined relative times with respect to a predetermined initial time; and a processor for combining said digital sample representations of said set of analog data signals, characterized in that:

said set of at least one sampling module comprises a set of acoustic charge transport memory modules, each connected to said input distribution means, containing means for passing an acoustic wave having an acoustic frequency into a charge transport channel and adapted to sample signals by transporting electron packets injected by said input signal into said charge transport channel in potential wells generated by said acoustic wave;

said at least one sampling module further includes trapping electrodes disposed above said charge transport channel for trapping said charge packets within said memory module upon application of a predetermined storage potential to said storage electrodes;

said controller means includes means for applying a SAW phase control signal to a memory module at a predetermined time with respect to said input signal to provide a predetermined phase relationship between said input signal and a SAW in said memory module controlled by said SAW phase control signal, whereby said set of sampling modules samples said input signal with a predetermined relative phase relationship;

said controller means further includes means for applying said storage potential to a sampling module to trap a set of sampled signals therein, said set of sampled signals having a predetermined relationship to said input signal;

said controller means further includes means for releasing sequentially predetermined members of said set of sampled signals from said sampling means to said digitizing means, whereby said set of sampled signals are sequentially digitized under control of said control means.

2. A system according to claim 1, further characterized in that said set of sampling modules are controlled to store sets of sampled signals having a predetermined relationship therebetween such that a first portion of an nth sample set overlaps in time a second portion of an (n+1)th sample set, whereby said nth and said (n+1)th sample sets sample said input signal at substantially the same points along said input signal;

said system further includes means for processing first and said second portions of digital representations of said sequential sample sets to produce conversion parameters to adjust a selected one of digital representations of said nth and (n+1)th sample sets, whereby discrepancies between different sampling modules may be compensated; and said system combines said sets of digital representations of said sample sets to form a combined output set of digital representations of said input signal.

3. A system according to claim 2, further comprising computation means for converting said sequential sample sets in accordance with said conversion parameters and for combining sets of signals so converted to form an output set of digital representations of said input signal.

* * * * *